United States Patent [19]

Schouwenhaars et al.

[11] Patent Number: 4,935,740
[45] Date of Patent: Jun. 19, 1990

[54] DIGITAL-TO-ANALOG CONVERTER

[75] Inventors: Henrikus J. Schouwenhaars; Dirk W. J. Groeneveld, both of Eindhoven, Netherlands

[73] Assignee: U.S. Philips Corporation, New York, N.Y.

[21] Appl. No.: 270,159

[22] Filed: Nov. 10, 1988

[30] Foreign Application Priority Data

Dec. 24, 1987 [NL] Netherlands ............... 8703128

[51] Int. Cl.$^5$ ........................................... H03M 1/76
[52] U.S. Cl. ....................................... 341/135; 341/144; 341/148
[58] Field of Search ............. 341/135, 144, 148, 150, 341/154

[56] References Cited

U.S. PATENT DOCUMENTS

| | | | |
|---|---|---|---|
| 3,940,760 | 2/1976 | Brokaw | 341/154 |
| 3,982,172 | 9/1976 | van de Plassche | 323/1 |
| 4,125,803 | 11/1978 | van de Plassche | 323/1 |
| 4,573,005 | 2/1986 | van de Plassche | 341/135 |
| 4,644,325 | 2/1987 | Miller | 341/135 |
| 4,695,826 | 9/1987 | Ando et al. | 341/144 |
| 4,701,694 | 10/1984 | Penney et al. | 341/144 |
| 4,703,310 | 10/1987 | van de Plassche | 341/144 |

Primary Examiner—William M. Shoop, Jr.
Assistant Examiner—Gary J. Romano
Attorney, Agent, or Firm—Bernard Franzblau

[57] ABSTRACT

A digital-to-analog converter which comprises
   an input terminal (1) for receiving a digital input signal,
   an output terminal (2) for supplying the analog output signal,
   a current source circuit (3) having N current sources ($I_1$ to $I_N$) for generating N currents of substantially equal current intensity at N outputs (3.1 to 3N), and
   a combination circuit (4) having N inputs (4.1 to 4N) coupled to the N outputs of the current source circuit and an input (6) for receiving the digital input signal and an output (7).

In order to convert a digital signal D which is presented to the input terminal (1) during a time interval (Ta), the time interval is sub-divided into at least two sub-intervals ($T_{d1}$, $T_{d2}$).

The combination circuit is now adapted to combine the currents of the current sources each time during a sub-interval in a manner such that the currents, of each time of a different combination of d from the N current sources, are combined in each sub-interval located within the time interval where d is the decimal representation of the digital signal D.

10 Claims, 4 Drawing Sheets

DIGITAL-TO-ANALOG CONVERTER

BACKGROUND OF THE INVENTION

This invention relates to a digital-to-analog converter for converting a digital input signal into an analog output signal, comprising an input terminal for receiving the digital input signal, an output terminal for supplying the analog output signal, a current source circuit having N current sources and adapted to generate N currents in a well-defined ratio at N outputs, a combination circuit for composing an analog signal, as a function of the digital input signal, from the currents available at the outputs of the current source circuit, said combination circuit having N inputs coupled to the N outputs of the current source circuit, another input coupled to the input terminal for receiving the digital input signal and an output coupled to the output terminal.

A digital-to-analog converter of this type is known from U.S. Pat. No. 4,703,310 (10/27/87).

This type of digital-to-analog converter uses the dynamic permutation principle known from U.S. Pat. No. 3,982,172 and U.S. Pat. No. 4,125,803 which Patents are hereby incorporated by reference. According to this principle currents having an accurate mutual amplitude ratio are generated in the current source circuit by coupling substantially equal currents to the outputs in accordance with a cyclic permutation. The known current source circuit comprises a permutation circuit for this purpose. Due to the cyclic permutation the relative deviation of each of the originally generated currents with respect to a mean value appears equally often per cycle in each of the output currents. Consequently, each output current has a D.C. component having a very accurate amplitude ratio with respect to the mean value of the originally generated currents and hence with respect to each D.C. component of the other output currents. The mutual deviations between the originally generated currents appear as A.C. components in these output currents, which A.C. components may or may not be disturbing, dependent on the permutation frequency with respect to the highest signal frequency and dependent on the mutual amplitude ratio of the originally generated currents.

In those cases in which these A.C. components may be disturbing, they may be filtered out by adding an averaging circuit to each output of the current source circuit. This make it possible to perform a digital-to-analog conversion without any problems by means of the combination circuit and with the aid of the thus generated direct currents. The aforementioned amplitude ratio is each time a factor of two. The currents to be switched are then directly switched on by an associated bit of the digital signal so as to generate the analog signal corresponding to the digital signal.

To obtain the currents in a well-defined ratio, the current source circuit uses shift registers whose number increases as the number of currents to be generated in the current source circuit increases. This results in a large power dissipation in the known D/A converter.

SUMMARY OF THE INVENTION

It is an object of the invention to provide a D/A converter which is simpler and requires fewer components so that the power dissipation may be lower, while nevertheless providing compensation for the inequality in the currents.

To this end the digital-to-analog converter according to the invention is characterized in that the current source circuit is adapted to generate N currents of substantially equal current amplitude, in that for converting a digital signal D presented to the input terminal during a time interval this time interval is subdivided into at least two sub-intervals, and in that the combination circuit is adapted to combine the currents of d current sources each time during a sub-interval in such a manner that the currents of each time a different combination of d from the N current sources are combined in each sub-interval located within the time interval, d being the decimal representation of the digital signal D. The invention is based on the recognition that the D/A converter can also be realised in a different manner than is described in the U.S. Pat. No. 4,703,310. In fact, starting from original currents having a substantially equal current intensity (but having an inequality due to the non-linearities and the positioning of the current sources in different places on a substrate) an analog signal is directly composed which is the analog representation of the digital signal D presented to the input terminal. The permutation circuit present in the known current source circuit is thus superfluous in this case. An analog output signal in which the inequality in current amplitude is compensated for is obtained by each time controlling a different combination of the current sources in the sub-intervals located within a time interval and by possibly arranging an averaging circuit between the output of the combination circuit and the output terminal.

The digital-to-analog converter may be further characterized in that, while adding an index x (x is an integer and $1 \leq x \leq N$) to the current sources, the combination circuit is adapted to combine in a j-th sub-interval of the J sub-intervals located within the time interval the currents of the current sources with the index $\{(j-1).N+J\}/J$ to $\{(j-1).N+d.J\}/J$ inclusive if j is odd and to combine the currents of the current sources with the index $(j.N-d.J+J)/J$ to $j.N/J$ inclusive if j is even, while j ranges from 1 to J, and if an index x calculated in accordance with one of the foregoing formulas has a value which is larger than N or smaller than 1, an index x' is taken instead of this index for which $$x' = x \bmod N.$$

Particularly in a digital-to-analog converter in which the current sources are aligned on a substrate, the combination circuit may be adapted to combine the currents of the current sources with index 1 to d inclusive in a first sub-interval and to combine the currents of the current sources with index N+1-d to N inclusive in a second sub-interval.

Such a converter make it possible to compensate for a linear gradient across the current amplitudes of the N current sources. If the combination circuit is also adapted to combine the currents of the current sources with index N/2+1 to N/2+d inclusive in a third sub-interval and if it is adapted to combine the currents of the current sources with index N/2+1-d to N/2 inclusive in a fourth sub-interval, it is possible to compensate for a gradient across the current amplitudes of the N current sources, which gradient is symmetrical with respect to the center.

BRIEF DESCRIPTION OF THE DRAWINGS

The invention will now be described in greater detail, by way of example, with reference to the accompanying drawings, in which:

FIG. 2 shows the currents of the N current sources in FIG. 2a, the current sources coupled to the output of the combination circuit in the first sub-interval in FIG. 2b and the current sources coupled to the output of the combination circuit in the second sub-interval in FIG. 2c.

DESCRIPTION OF THE PREFERRED EMBODIMENTS

Figure 1:
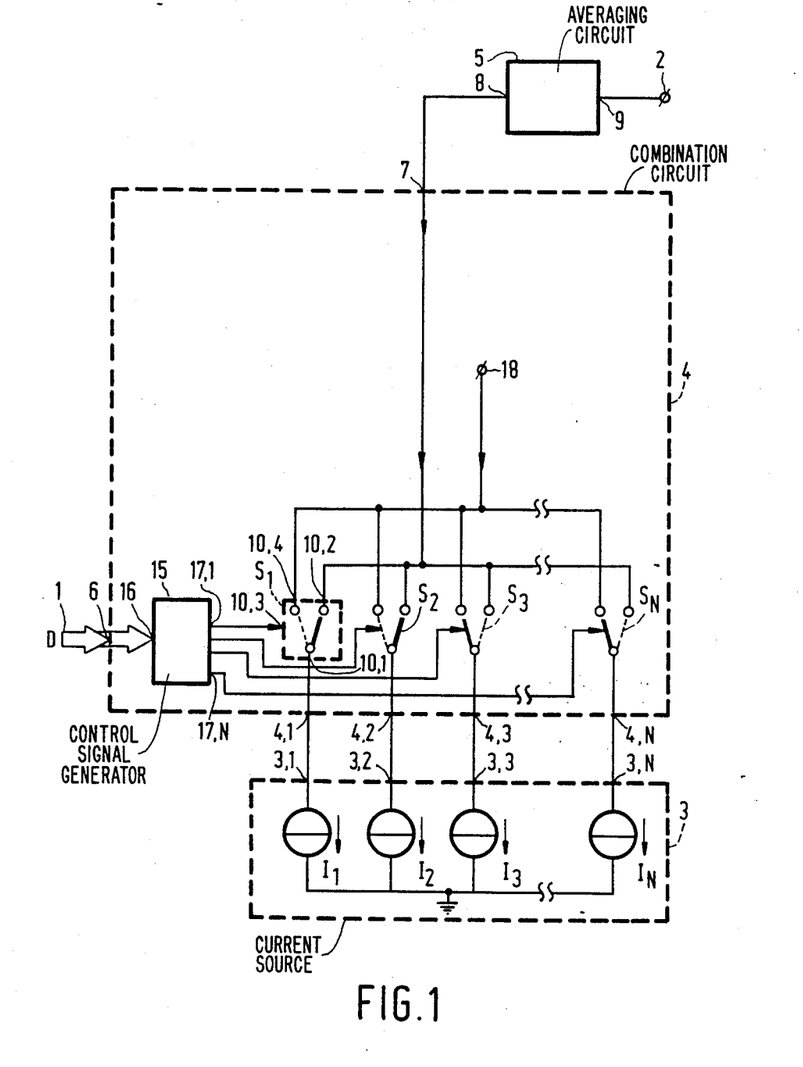
FIG. 1 shows a first embodiment of the invention.

FIG. 1 shows a first embodiment of a D/A converter according to the invention, comprising an input terminal 1 for receiving a digital input signal D, an output terminal 2 for supplying the analog output signal, a current source circuit 3 comprising N current sources for supplying N currents $I_1$ to $I_N$ having a substantially equal current intensity, a combination circuit 4 and an averaging circuit 5. N outputs 3.1 to 3.N of the current source circuit 3 are each coupled to an associated input 4.1 to 4.N, respectively, of the combination circuit 4. The combination circuit 4 has another input 6 which is coupled to the input terminal 1, and an output 7 which is coupled to an input 8 of the averaging circuit 5, whose output 9 is coupled to the output terminal 2.

The combination circuit 4 also comprises N switching units $S_1$ to $S_N$, each having an input 10.1, an output 10.2 and a control signal input 10.3. These reference numerals are only indicated for the switching unit $S_1$, but they also apply to the switching units $S_2$ to $S_N$. Each of the inputs 4.1 to 4.N of the combination circuit 4 is coupled to the associated input 10.1 of a respective one of the switching units $S_1$ to $S_N$.

All outputs 10.2 of the switching units $S_1$ to $S_N$ are coupled to the output 7. A control signal generator 15 is also provided. The control signal generator 15 has an input input 16 which is coupled to the input 6 of the combination circuit and N outputs 17.1 to 17.N each coupled to an associated control signal input 10.3 of a respective one of the switching units $S_1$ to $S_N$.

The averaging circuit 5 is adapted to average the output signal of the combination circuit 4 each time over a time interval Ta, as will be apparent hereinafter. The averaging circuit is neither essential nor necessary to the invention.

For converting a digital signal D (which consists of an n bit digital number of "ones" and "zeros") the time interval, being the averaging period for the averaging circuit 5, is sub-divided into at least two sub-intervals and the digital signal D is presented to the input terminal 1 during the time interval Ta.

The combination circuit is now adapted to combine currents of d current sources, each time during a sub-interval $T_{di}$ located within the time interval Ta, in a manner such that in each sub-interval the currents of each time a different combination of d from the N current sources $I_1$ to $I_N$ are combined, in which d is the decimal representation of the digital signal D.

The specific operation of the embodiment of FIG. 1 will be described in greater detail with reference to FIG. 2.

Figure 2A:
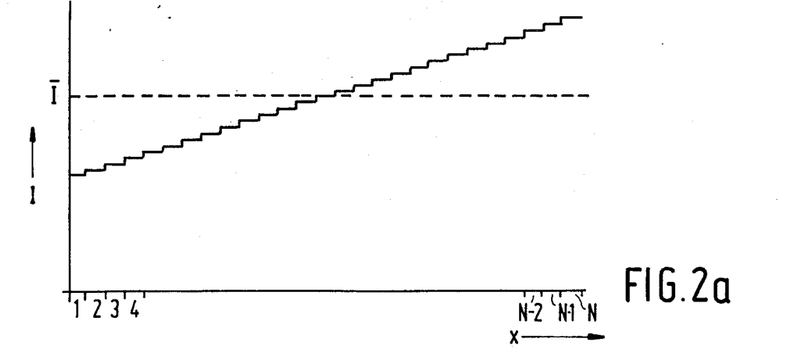
Figure 2B:
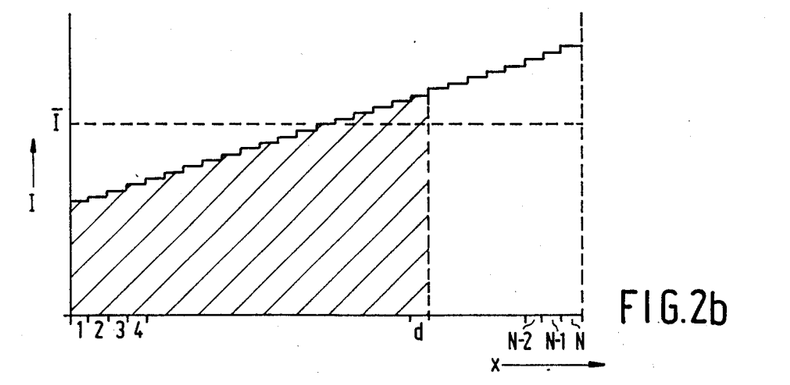

FIG. 2a shows the current distribution I over the N current sources $I_1$ to $I_N$. The current intensity I is plotted on the vertical axis and the ordinal number x of the current source is plotted on the horizontal axis. It will be clear from FIG. 2a that there is a linear variation across the current intensities of the current sources. This occurs, for example, if the current sources are integrated and if they are aligned on a substrate. The reference $\bar{I}$ denotes the average current intensity for all current intensities. The control signal generator 15 generates switching signals at the outputs 17.1 to 17.d in the first sub-interval, in dependence upon the digital signal D which is presented to the input 16. Under the influence of these switching signals the switching units $S_1$ to $S_d$ are closed, that is to say, they provide a through-connection between the input 10.1 and the output 10.2. This is shown in FIG. 1 for the switching units $S_1$ and $S_2$. A current intensity which is equal to $$I_1 + I_2 + \ldots + I_{d-1} + I_d$$

now flows via the output 7. This is indicated in FIG. 2b by means of the shaded area.

Figure 2C:
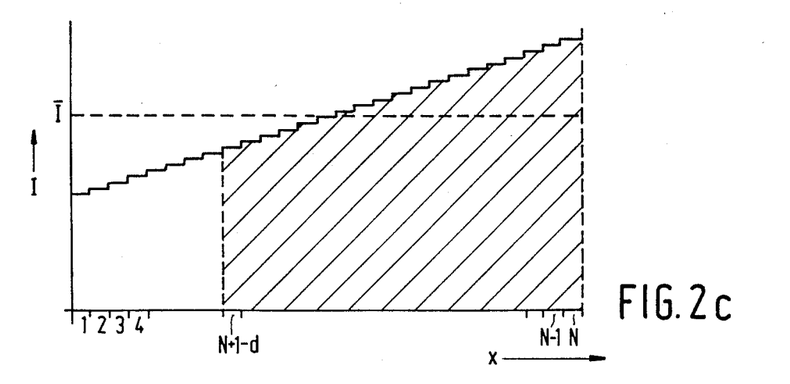

In the second sub-interval the control signal generator 15 generates control signals at the outputs 17.N+1-d to 17.N, also in dependence upon the digital signal D. This means that the switching units $S_{N+1-d}$ to $S_N$ are closed. A current intensity which is equal to $$I_{N+1-d} + \ldots + I_{N-1} + I_N$$

now flows via the output 7. This is indicated in FIG. 2c by means of the shaded area.

Averaging of the two current intensities in the averaging circuit 5 implies that a current intensity is supplied at the output terminal 2 which is equal to $$d.\bar{I},$$

for each value of the digital signal D. It is clear that in this manner the linear variation across the current intensities is corrected.

The averaging circuit may be, for example, a low-pass filter.

The terminal 18 which is coupled to the outputs 10.4 of the switching units $S_1$ to $S_N$ is used for removing the current of the current sources which are not switched on, which means that the associated switching unit is in a position in which the input 10.1 is coupled to the output 10.4.

Figure 3:
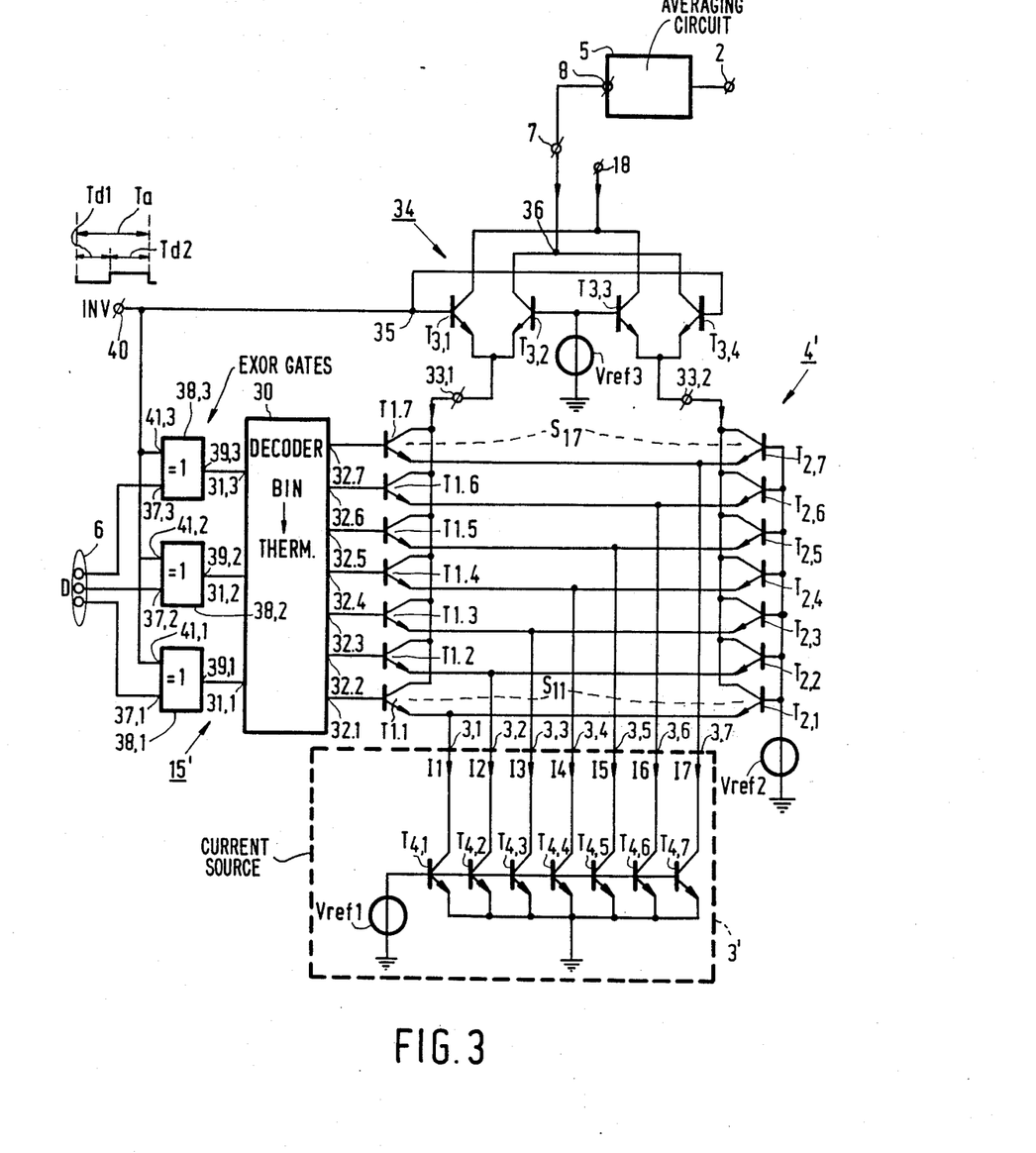
FIG. 3 shows a second embodiment of the invention.

FIG. 3 shows a second embodiment which shows a great resemblance to that of FIG. 1. The N (=7) current sources are realised by means of seven npn transistors $T_{4.1}$ to $T_{4.7}$ all of whose emitters are coupled to ground and whose bases receive the voltage $V_{ref1}$. The collectors of the transistors constitute the outputs 3.1 to 3.7 of the current source circuit 3'.

The control signal generator 15' includes a converter 30 which converts a (3-bit) digital signal applied to its input 31.1, 31.2, 31.3 into a so-called thermometer code. This means that, dependent on the decimal value d corresponding to the digital signal D presented to the input 31, d outputs, namely the outputs 32.1 to 32.d of the outputs 32.1 to 32.7 become "high", i.e. "logic one". The outputs 32.1 to 32.7 are each coupled to a base of an associated npn transistor of the 7 npn transistors $T_{1.1}$ to $T_{1.7}$. The emitters of these transistors $T_{1.i}$ are each coupled to an emitter of an associated transistor $T_{2.i}$ of the npn transistors $T_{2.1}$ to $T_{2.7}$, i ranging from 1 to 7. The coupled emitters of the transistors $T_{1.i}$ to $T_{2.i}$ are coupled to the output 3.i of the current source circuit 3'. All bases of the transistors $T_{2.1}$ to $T_{2.7}$ receive the voltage $V_{ref2}$.

The two transistors $T_{1.i}$ and $T_{2.i}$ constitute a first switching units $S_{1.i}$ which has an input (being the coupled emitters), a control signal input (being the base of the transistor $T_{1.i}$) and a first and a second output (constituted by the collectors of the transistors $T_{1.i}$ and $T_{2.i}$, respectively). All first outputs (the collectors of the transistors $T_{1.1}$ to $T_{1.7}$) are coupled to a common terminal 33.1. All second outputs (the collectors of the transistors $T_{2.1}$ to $T_{2.7}$) are coupled to a common terminal 33.2. These two terminals constitute the first and the second input of a second switching unit 34 which has a control signal input 35 and an output 36 which is coupled to the output 7 of the combination circuit 4'.

The second switching unit 34 comprises four npn transistors $T_{3.1}$ to $T_{3.4}$. The emitters of the transistors $T_{3.1}$ and $T_{3.2}$ are coupled to the terminal 33.1. The emitters of the transistors $T_{3.3}$ and $T_{3.4}$ are coupled to the terminal 33.2. The bases of the transistors $T_{3.1}$ and $T_{3.4}$ are coupled to the control signal input 35. The bases of the transistors $T_{3.2}$ and $T_{3.3}$ receive a voltage $V_{ref3}$. The collectors of the transistors $T_{3.2}$ and $T_{3.4}$ are coupled to the output 36. The collectors of the transistors $T_{3.1}$ and $T_{3.3}$ are coupled to the terminal 18.

The 3-bit digital signal D is presented to the input 6.

Each of the three bits is applied via a separate lead to first inputs 37.1 to 37.3 of EXOR gates 38.1 to 38.3. Outputs 39.1 to 39.3 of the three EXOR gates 38 are coupled to the respective 31.1 to 31.3 of the converter 30.

A control signal input 40 is coupled to the input 35 and to second inputs 41.1, 41.2 and 41.3 of the EXOR gates 38.1, 38.2 and 38.3, respectively.

In a first sub-interval $T_{d1}$ located in the time interval Ta a first control signal, being a "logic zero" or "low" signal, is presented to the input 40. The EXOR gates 38 pass the digital signal D in an unchanged form. This means that d outputs 32.1 to 32.d of the converter 30 are "high". This results in the current sources $T_{4.1}$ to $T_{4.d}$ being coupled to the output 33.1 via the transistors $T_{1.1}$ to $T_{1.d}$ which become conducting. Due to the "low" control signal at the bases of the transistors $T_{3.1}$ and $T_{3.4}$ and the signal $V_{ref3}$ at the bases of the transistors $T_{3.2}$ and $T_{3.3}$, the transistors $T_{3.2}$ and $T_{3.3}$ are turned on and the others are turned off. Thus a current amplitude corresponding to the shaded area under the curve I in FIG. 2b flows via the output 36.

In the second sub-interval $T_{d2}$ located within the time interval Ta, a second control signal, being a "logic 1" or "high" signal, is presented to the input 40. The EXOR gates 38 now pass a digital signal which is the inverse of the digital signal D, or $\overline{D}$. This means that the outputs 32.1 to 32.N-d of the converter 30 are "high". This results in the current sources $T_{4.1}$ to $T_{4.N-d}$ being coupled to the output 33.1 via the transistors $T_{1.1}$ to $T_{1.N-d}$ which become conducting. Thus, a current amplitude corresponding to the non-shaded area under the curve I in FIG. 2c flows via this output.

Due to the fact that the outputs 32.N+1-d to 32.N of the converter 30 are "low", the transistors $T_{2.N+1-d}$ to $T_{2.N}$ are turned on. Consequently, a current intensity corresponding to the shaded area under the curve I in FIG. 2c flows via the output 33.2.

Since a logic "high" signal is applied to the bases of the transistors $T_{3.1}$ and $T_{3.4}$, these two transistors are turned on and the transistors $T_{3.2}$ and $T_{3.3}$ are turned off. The input 33.2 is now coupled to the output 36. Thus, a current amplitude corresponding to the shaded area under the curve I in FIG. 2c flows via the output 36.

The averaging in the averaging circuit 5 then results in an analog output signal of $d.\overline{I}$ at the terminal 2.

The embodiments of FIGS. 1 and 3 are particularly suitable for compensating a linearly varying gradient across the current intensities. These embodiments are less suitable for compensating higher order gradients across the current intensity, such as a gradient having a symmetrical variation with respect to the centre.

Figure 4:
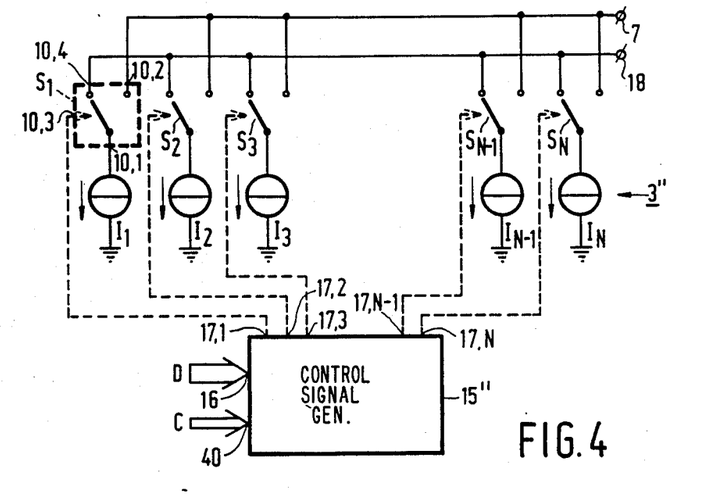
FIG. 4 shows a third of the invention.
Figure 5:
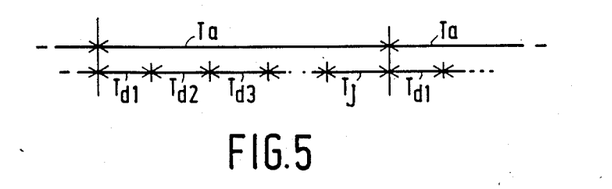
FIG. 5 shows the sub-division of a time interval into J sub-intervals.

The embodiment of FIG. 4 is more suitable to correct for these gradients which vary other than linearly. The embodiment of FIG. 4 shows a great resemblance to the embodiment of FIG. 1. The control signal generator 15" receives the digital signal D during the time interval Ta via an input 16 and the first control signal C via the input 40. The control signal C ensures that the time interval Ta is sub-divided into J sub-intervals $T_{dj}$, and that the control signal generator 15" generates d switching signals in each of these J sub-intervals at d of the N outputs 17.

In each sub-interval each time a different combination of d of the N outputs 17 is supplied with the d switching signals. Under the influence of a switching signal applied to the control signal input 10.3 a switching unit such as switching unit $S_1$ will assume the position other than the one shown, which means that each time a different combination of d current sources is coupled to the output 7 in each of the sub-intervals.

The control signal generator 15" may be arranged so that in the j-th sub-interval $T_{dj}$ the current sources $I_x$, with the index x being equal to $\{(j-1)N+J\}/J$ to $\{(j-1)N+d.J\}/J$, are coupled to the output 7, when j is odd, or the current sources $I_x$, with the index x being equal to $(j.N-d.J+J)/J$ to $j.N/J$, are coupled to the output 7, when j is even.

For j=2 the embodiments of FIG. 1 or 3 apply again.

Figure 6:
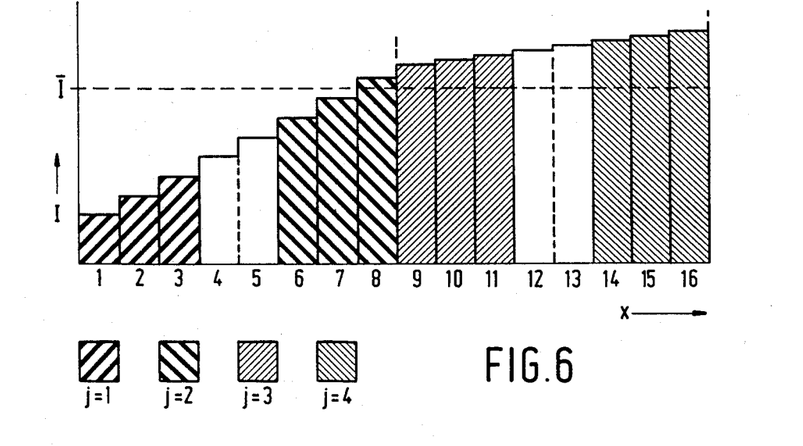
FIG. 6 shows the current amplitudes of N current sources in which a higher order gradient is present across the current amplitudes, and the current sources which are coupled to the output of the combination circuit in the four sub-intervals in a time interval.

An embodiment in which J=4 will be described in greater detail with reference to FIG. 6. It is assumed that the current source circuit 3" comprises sixteen current sources. In FIG. 6 a gradient across the sixteen current sources is assumed to consist of a first order (linear) gradient and a second order (symmetrical) gradient.

In the first sub-interval (j=1) the current sources $I_1$ to $I_d$ are coupled to the output 7. As it is assumed in FIG. 6 that d=3, this means that the first three current sources $I_1$, $I_2$ and $I_3$ are coupled to the output 7, see the shaded area in fat lines extending diagonally from bottom left to top right in FIG. 6.

In the second sub-interval (j=2) the current sources with the index N/2-d+1 to N/2 are coupled to the output 7. This means the current sources $I_6$, $I_7$ and $I_8$, see the shaded area in fat lines extending diagonally from top left to bottom right in FIG. 6.

In the third sub-interval (j=3) the current sources with the index N/2+1 to N/2+d are coupled to the output 7, i.e. the current sources $I_9$ to $I_{11}$, see the shaded area in thin lines extending diagonally from bottom left to top right in FIG. 6.

In the fourth sub-interval (j=4) the current sources with the index N−d+1 to N are coupled to the output 7, i.e. the current sources $I_{14}$, $I_{15}$ and $I_{16}$, see the shaded area in thin lines extending diagonally from top left to bottom right in FIG. 6.

After averaging in the averaging circuit (not shown) connected to the output 7, a current amplitude of $d.\bar{I}$ is generated at the output of the D/A converter, in which $\bar{I}$ is the average value of the 16 current intensities.

It is of course evident that the order of the (four) sub-intervals may be different.

If d should be larger than N/2, the upper limit $\{(j−1)N+d.J\}/J$, for j odd, yields an index which may be larger than N. Similarly the lower limit $(j.N−dJ+J)/J$, for j even, yields an index which may be smaller than or equal to zero.

The control signal generator 15″ is now adapted to be such that the index 1, 2, 3 etc is taken for the indices N+1, N+2, N+3, etc. (that is to say, the value N is subtracted from the index) and that the index 16, 15, 14 etc. is taken for the indices 0, 1, 2 etc.

Or: $x' = x \bmod N$.

It is to be noted that the invention is not limited to the embodiments shown. The invention can also be used for embodiments which differ from the embodiments shown in aspects not relating to the invention.

What is claimed is:

1. A digital-to-analog converter for converting a digital input signal into an analog output signal, comprising:

an input terminal for receiving the digital input signal.

an output terminal for supplying the analog output signal, a current source circuit having N current sources adapted to generate N substantially equal currents at N outputs, a combination circuit for deriving an analog signal as a function of the digital input signal from the currents available at the outputs of the current source circuit, said combination circuit having N inputs coupled to the N outputs of the current source circuit, another input coupled to the input terminal for receiving the digital input signal and an output coupled to the output terminal, characterized in that a digital signal D is applied to the input terminal during a time interval that is sub-divided into at least two sub-intervals, and in that the combination circuit is adapted to combine the currents of d current sources during each sub-interval in a manner such that the currents of a different combination of d current sources of the N current sources are combined in each sub-interval located within the time interval, where d is the decimal representation of the digital signal D.

2. A digital-to-analog converter as claimed in claim 1, characterized in that, while adding an index x (x being an integer and $1 \leq x \leq N$) to the current sources, the combination circuit is adapted to combine in a j-th sub-interval of J sub-intervals located within the time interval the currents of the current sources with index $\{(j−1).N+J\}/J$ to $\{(j−1).N+d.J\}/J$ inclusive if j is odd to combine the currents of the current sources with index $(j.N−d.J+J)/J$ to $j.N/J$ inclusive if j is even, where j ranges from 1 to J, and if an index x calculated in accordance with one of the foregoing formulas has a value which is larger than N or smaller than 1, an index x′ is taken instead of said index x for which $$x' = x \bmod N.$$

3. A digital-to-analog converter as claimed in claim 1, characterized in that the current sources are aligned on a substrate and in that, while adding an index x (x being an integer and $\leq N$) to the current sources in which the index 1 is assigned to one of the outer current sources, subsequent indices are assigned to subsequent adjacent current sources and the highest index being assigned to the other outer current source, the combination circuit is adapted to combine the currents of the current sources with index 1 to d inclusive in a first sub-interval and being adapted to combine the currents of the current sources with index N+1-d to N inclusive in a second sub-interval.

4. A digital-to-analog converter as claimed in claim 3, characterized in that N is even and in that the combination circuit is also adapted to combine the currents of the current sources with index N/2+1 to N/2+d inclusive in a third sub-interval, and is adapted to combine the currents of the current sources with index N/2+1−d to N/2 inclusive in a fourth sub-interval.

5. A digital-to-analog converter as claimed in claim 1, characterized in that the combination circuit comprises N switching units, each having an input, a control signal input and an output, and a control signal generator having an input and N outputs, in that each of the N inputs of the combination circuit is coupled to an associated input of a respective one of the N switching units all of whose outputs are coupled to the output of the combination circuit, in that the other input of the combination circuit is coupled to the input of the control signal generator for receiving the digital input signal, in that each of the N outputs of the control signal generator is coupled to an associated control signal input of a respective one of the N switching units, in that the control signal generator is adapted to generate d switching signals in dependence upon the digital signal D presented to the input and to apply said d switching signals each time to a different combination of d outputs of the control signal generator in each sub-interval located within the time interval, and in that each switching unit is adapted to couple its input to its output under the influence of a switching signal applied to its control signal input.

6. A digital-to-analog converter as claimed in claim 3, characterized in that the combination circuit comprises N first switching units, each having an input, a control signal input and a first and a second output, a second switching unit having a first and a second input, a control signal input and an output and a control signal generator having an input and N outputs, in that each of the N inputs of the combination circuit is coupled to an associated input of one of the N first switching units, the first outputs of all N first switching units being coupled to the first input of the second switching unit, the second outputs of all N first switching units being coupled to the second input of the second switching unit, the output of the second switching unit being coupled to the output of the combination circuit, the other input of the combination circuit being coupled, via a converter unit having a control signal input, to the input of the control signal generator, each of the N outputs of the control signal generator being coupled to an associated control signal input of a respective one of the N first switching units, the converter unit being adapted to pass the digital signal D to the input of the control signal generator under the influence of a first control signal which is presented to the control signal input of the converter unit, during the first sub-interval, and to pass an inverted digital signal $\overline{D}$ to the input of the control signal generator under the influence of a second control signal which is presented to the control signal input of the converter unit during the second sub-interval, the control signal generator being adapted to generate d first switching signals and N-d second switching signals in dependence upon the digital signal D presented to its input during the first sub-interval, to apply said first switching signals to the first d outputs and to apply said second switching signals to the remaining N-d outputs, the control signal generator being also adapted to generate N-d first switching signals and d second switching signals in dependence upon the digital signal $\overline{D}$ presented to its input during the second sub-interval, to apply said first switching signal to the first N-d outputs and to apply said second switching signals to the remaining outputs, each of the first switching units being adapted to couple its input to its first output under the influence of the first switching signal and to couple its input to its second output under the influence of the second switching signal, the second switching unit being adapted to couple its first input to its output under the influence of the first control signal and being adapted to couple its second input to the output under the influence of the second control signal, said first and second control signals being presented to the control signal input of the second switching unit during the first and the second sub-interval, respectively.

7. A digital-to-analog converter as claimed in claim 1, characterized in that an averaging circuit is coupled between the output of the combination circuit and the output terminal, said averaging circuit being adapted to average an analog output signal of the combination circuit each time over a time interval.

8. A digital-to-analog converter as claimed in claim 1, wherein the combination unit includes means for combining the currents of the current sources with an index 1 to d inclusive in a first sub-interval and which is adapted to combine the currents of the current sources with an index N+1-d to N inclusive in a second sub-interval.

9. A digital-to-analog converter as claimed in claim 8, wherein N is an even number and said combining means of the combination unit is adapted to combine the currents of the current sources with an index N/2+1 to N/2+d inclusive in a third sub-interval, and is further adapted to combine the currents of the current sources with an index N/2+1-d to N/2 inclusive in a fourth sub-interval.

10. A digital-to-analog converter as claimed in claim 1, wherein the combination unit further comprises: N switching units, each having an input, a control signal input and first and second outputs, a control signal generator having an input and N outputs, means coupling each of the N inputs of the combination circuit to an associated input of a respective one of the N switching units all of whose first outputs are coupled to the output of the combination circuit, second means coupling the other input of the combination circuit to the input of the control signal generator, third means coupling each of the N outputs of the control signal generator to an associated control signal input of a respective one of the N switching units, fourth means coupling the second outputs of the switching units to a further output, said control signal generator being adapted to generate d switching signals as a function of the digital signal D at the other input and to apply said d switching signals to a different combination of d outputs of the control signal generator in each sub-interval, and wherein each switching unit is adapted to selectively couple its input to its first and second outputs in response to the switching signal applied to its control signal input from the control signal generator.

* * * * *

UNITED STATES PATENT AND TRADEMARK OFFICE
CERTIFICATE OF CORRECTION

PATENT NO. : 4,935,740

DATED : June 19, 1990

INVENTOR(S) : Hendrikus J. Schouwenaars et al

It is certified that error appears in the above-identified patent and that said Letters Patent is hereby corrected as shown below:

On the title page item [75] Inventor(s): please change the name of the first inventor from "Henrikus Schouwenhaars" to read --Hendrikus J. Schouwenaars--.

Signed and Sealed this

Twenty-first Day of April, 1992

Attest:

HARRY F. MANBECK, JR.

*Attesting Officer*  *Commissioner of Patents and Trademarks*